United States Patent
Yang (10) Patent No.: US 8,514,199 B2
(45) Date of Patent: Aug. 20, 2013

(54) CAPACITIVE TOUCH PANEL AND CAPACITANCE SENSING APPARATUS AND METHOD FOR THE SAME

(75) Inventor: Kai-Chieh Yang, Miao-Li County (TW)

(73) Assignee: Chimei Innolux Corporation (TW)

( * ) Notice: Subject to any disclaimer, the term of this patent is extended or adjusted under 35 U.S.C. 154(b) by 945 days.

(21) Appl. No.: 12/617,295

(22) Filed: Nov. 12, 2009

(65) Prior Publication Data

US 2010/0117986 A1 May 13, 2010

(30) Foreign Application Priority Data

Nov. 12, 2008 (TW) .............................. 97143687 A
Feb. 6, 2009 (TW) .............................. 98103890 A (51) Int. Cl.
*G06F 3/045* (2006.01)
(52) U.S. Cl.
USPC ........................................................ 345/174
(58) Field of Classification Search
None
See application file for complete search history.

(56) References Cited

U.S. PATENT DOCUMENTS

| 7,075,523 B2 * | 7/2006 | Marten et al. ................. 345/173 |
| 2007/0216657 A1 * | 9/2007 | Konicek ........................ 345/173 |
| 2008/0157893 A1 * | 7/2008 | Krah ........................ 331/177 R |

\* cited by examiner

*Primary Examiner* — Joseph Haley
*Assistant Examiner* — Emily Frank
(74) *Attorney, Agent, or Firm* — Lowe Hauptman & Ham, LLP (57) ABSTRACT

A capacitive touch panel and capacitance sensing apparatus and method for the same are disclosed. The capacitive touch panel includes a plurality of electrodes, a multiplexer and a capacitance sensing apparatus. The multiplexer selectively connects one of the electrodes to the capacitance sensing apparatus. The capacitance sensing apparatus includes a reference voltage source and a differential comparator, where the reference voltage source generates a modified reference voltage according to noise on stray capacitance of the capacitive touch panel. In a discharging process, the comparator compares an input voltage at the selected electrode and the modified reference voltage. The capacitance change in the electrode can be precisely detected because the noise is eliminated by differential comparison.

20 Claims, 12 Drawing Sheets

CAPACITIVE TOUCH PANEL AND CAPACITANCE SENSING APPARATUS AND METHOD FOR THE SAME

CROSS REFERENCE TO RELATED PATENT APPLICATIONS

The present application is based on, and claims priority from Taiwanese Application Nos. 097143687, filed Nov. 12, 2008 and 098103890, filed Feb. 6, 2009, the disclosures of which are hereby incorporated by reference herein in their entireties.

BACKGROUND OF THE INVENTION

1. Field of the Invention

The present invention relates to a touch panel, especially to a capacitive touch panel and the capacitance sensing apparatus and method for the same.

2. Description of Prior Art

Touch panels have extensive applications such as ATM, selling kiosk and industrial control system. The touch panel has gained more market as the popularization of smart phone and PDA, which also employ touch panel as input device for layman user.

The major touch panels include resistive type and capacitive type touch panels in terms of operation principles. More particularly, the resistive type senses a voltage corresponding to a pressing by finger or stylus. The capacitive type touch panel senses capacitance change caused by a touch of user finger, which draws little amount of current from the touch panel. The capacitive type touch panel can be further classified into surface capacitive touch panel and projected capacitive touch panel, where the projected capacitive touch panel becomes more attractive due to the realization of multi-touch function. The projected capacitive touch panel forms an In-Cell Multi-Touch Panel when it is integrated into a LCD screen and the thickness of the LCD screen is not significantly increased. In TFT LCD, indium tin oxide (ITO) is frequently used to lock storage charge and the ITO can also be used as sensor for high-density sensing when the TFT LCD is integrated with touch panel. Capacitance sensing apparatus is extremely important for TFT LCD with touch panel function because TFT induces considerable noise.

Figure 1:
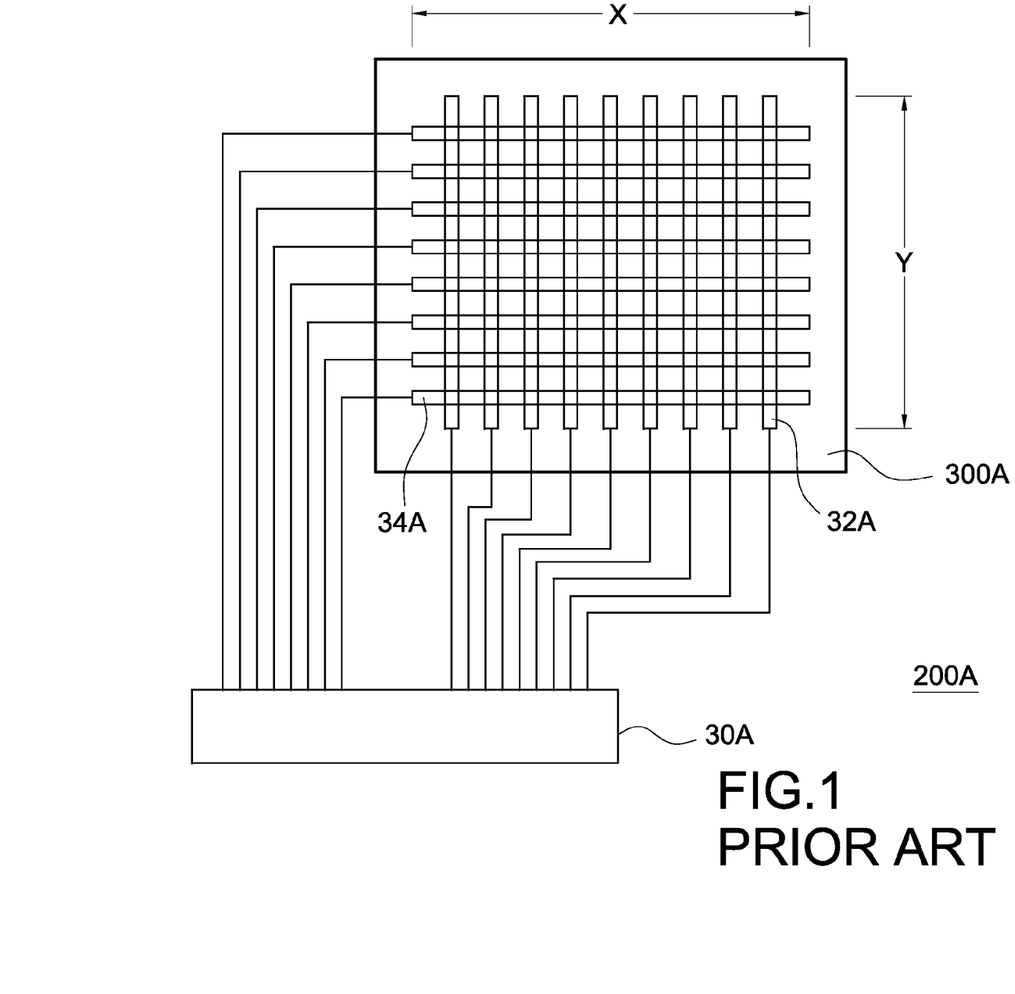
FIG. 1 shows a prior art projected capacitive touch panel.

FIG. 1 shows a prior art projected capacitive touch panel 200A, which comprises a projected capacitive touch panel unit 300A and a controller 30A. The projected capacitive touch panel unit 300A comprises an insulating base (not labeled), longitudinal stripe electrodes 32A, and transverse stripe electrodes 34A, where longitudinal stripe electrodes 32A and transverse stripe electrodes 34A are perpendicular to each other. It should be noted that FIG. 1 shows only a simplified projected capacitive touch panel 200A, the longitudinal stripe electrodes 32A and transverse stripe electrodes 34A are on opposite faces of the insulating base, and the number thereof are M and N, respectively. Therefore, the controller 30A has (M+N) input lines and detects a touch position on the projected capacitive touch panel unit 300A by sensing capacitance variation between electrodes through the longitudinal stripe electrodes 32A and transverse stripe electrodes 34A.

Figure 2:
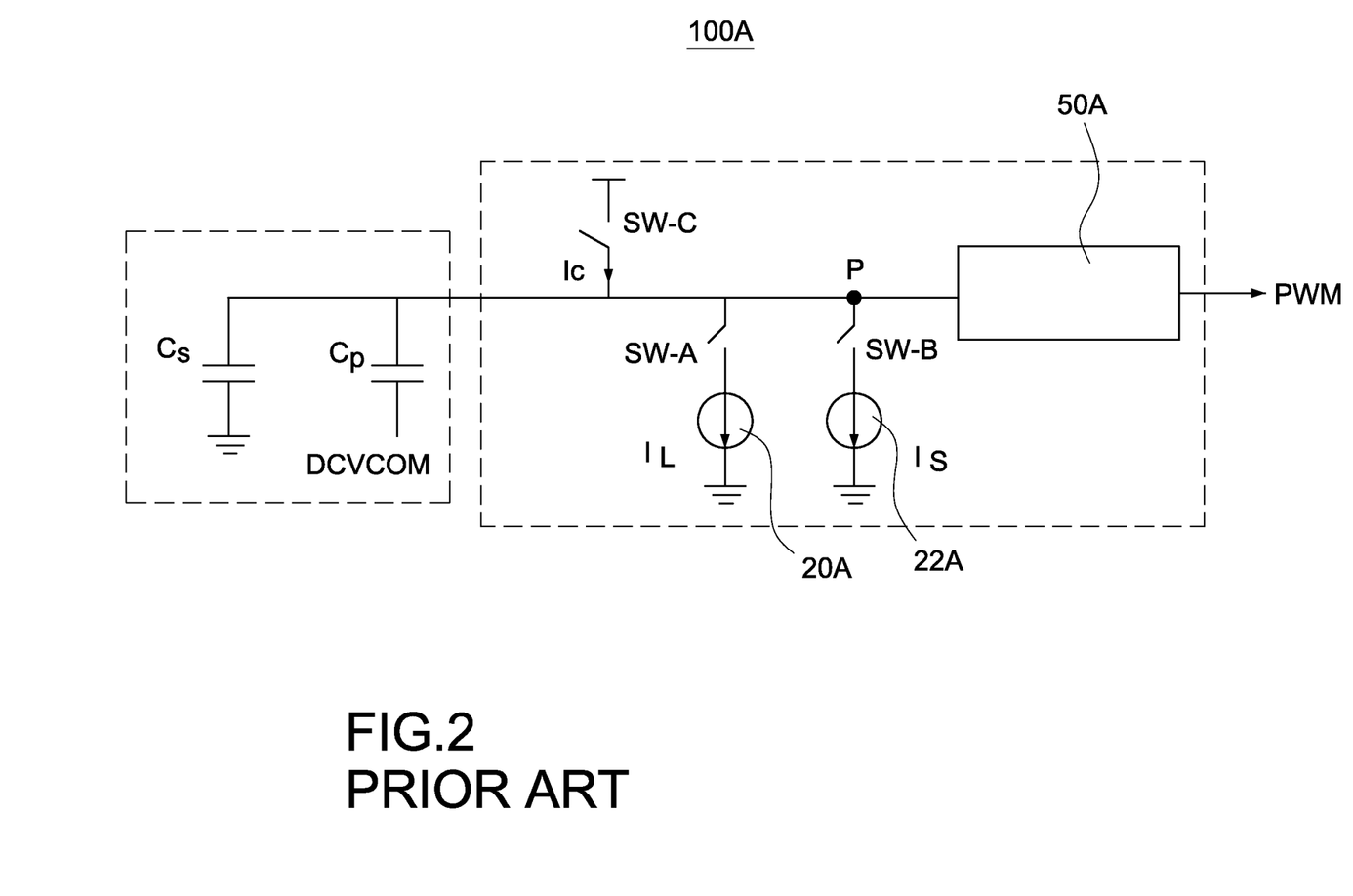
FIG. 2 shows a related art capacitance sensing circuit.

FIG. 2 shows a related art capacitance sensing circuit 100A in a projected capacitive touch panel, where the capacitance sensing circuit 100A can be built-in the controller 30A shown in FIG. 1 to sense capacitance variation for the controller 30A, therefore the controller 30A can detect touch position. Provided that Cs denotes the contact capacitance caused by a touch on the Kth longitudinal stripe electrode 32A and Cp denotes stray capacitance, the capacitance sensing circuit 100A charges a charge Q to the contact capacitance Cs and stray capacitance Cp through a charging current source Ic. Afterward, the capacitance sensing circuit 100A first discharges the contact capacitance Cs and stray capacitance Cp through a larger discharging current source 20A and then discharges the contact capacitance Cs and stray capacitance Cp through a smaller discharging current source 22A. According to formula $Q=C\times V$, the voltage at connection node P changes when capacitance (overall effect of the contact capacitance Cs and stray capacitance Cp) is changed by finger touch. Whether a touch is present on the Kth longitudinal stripe electrode 32A can be identified by comparing the voltage at connection node P and a reference voltage with a comparator 50A.

More particularly, the controller 30A periodically turns on the charging switch SW_C, the first discharging switch SW_A, and the second discharging switch SW_B, respectively, and the comparator 50A outputs pulse width modulation (PWM) signal indicating whether a touch is present on the Kth longitudinal stripe electrode 32A and the touch position. The controller 30A judges whether a touch is present on the Kth longitudinal stripe electrode 32A and the exact touch position by reading the PWM output signal from the comparator 50A. The capacitance sensing circuit 100A in turn conducts measurement on the longitudinal stripe electrodes 32A and transverse stripe electrodes 34A, whereby the controller 30A knows capacitance variation on the electrodes and the exact touch position on the touch panel.

However, there are two drawbacks in above-mentioned related art capacitance sensing circuit:

1. The stray capacitance Cp is larger than the contact capacitance Cs, generally being 1000 times of the contact capacitance Cs. The measuring accuracy is influenced when noise is imposed on the stray capacitance Cp. When the touch panel is employed in LCD screen, stray capacitance Cp is very large and the contact capacitance Cs is difficult to measure because the ITO electrode in the LCD screen is very close to the DCVCOM electrode. Moreover, the capacitance measurement is also hindered by noise coupled from the capacitance sensing circuit 100A on lower plate to the stray capacitance Cp on the upper plate of LCD screen.

2. The wiring is complicated because (M+N) signal lines are necessary to measure signals from the M longitudinal stripe electrodes 32A and the N transverse stripe electrodes 34A.

SUMMARY OF THE INVENTION

It is an object of the present invention to provide a capacitance sensing apparatus with eliminated noise for a capacitive touch panel.

It is another object of the present invention to provide a capacitive touch panel, which could be operated with lower noise.

Accordingly, the present invention provides a capacitance sensing apparatus used for a capacitive touch panel and electrically connected to one electrode of the capacitive touch panel through a connection node to measure a capacitance on the electrode. The capacitance sensing apparatus comprising: a first discharging current source electrically connected the connection node to provide a first discharging current; a second discharging current source electrically connected the connection node to provide a second discharging current, where the first discharging current is larger than the second discharging current; a differential comparator comprising a first input end electrically connected to the connection node and a second input end; a reference voltage source electrically connected to the second input end, wherein the reference voltage source receives a predetermined reference voltage and a DC voltage of an liquid crystal display to generate a modified reference voltage, wherein the DC voltage is also electrically connected to the capacitive touch panel. The differential comparator generates a pulse width modulation (PWM) signal by comparing the modified reference voltage and an input voltage at the connection node and resulted from a touch on the capacitive touch panel. The PWM signal indicates the capacitance on the electrode and the capacitance can be precisely measured because noise is suppressed by the differential comparator.

Accordingly, the present invention provides a capacitive touch panel. The capacitive touch panel comprises a plurality of first electrodes in longitudinal direction and having a first number M; a plurality of second electrodes in transversal direction and having a second number N; and a capacitance sensing apparatus electrically connected a selected electrode at a connection node, wherein the selected electrode is selected from the first electrodes and the second electrodes. The capacitance sensing apparatus comprises a first discharging current source electrically connected the connection node to provide a first discharging current; a second discharging current source electrically connected the connection node to provide a second discharging current, where the first discharging current is larger than the second discharging current; a differential comparator comprising a first input end electrically connected to the connection node and a second input end; a reference voltage source electrically connected to the second input end, wherein the reference voltage source receives a predetermined reference voltage and a DC voltage of an liquid crystal display to generate a modified reference voltage, wherein the DC voltage is also electrically connected to the capacitive touch panel. The differential comparator generates a pulse width modulation (PWM) signal by comparing the modified reference voltage and an input voltage at the connection node and resulted from a touch on the capacitive touch panel. The PWM signal indicates the capacitance on the electrode and the capacitance can be precisely measured because noise is suppressed by the differential comparator.

According to one aspect of the present invention, the capacitive touch panel further comprises a multiplexer, and the multiplexer comprises a plurality of switches corresponding to and electrically connected to the first electrodes and the second electrodes. The multiplexer generate a third number of control signals and the third number is one plus the larger of the first number and the second number. The multiplexer controls the switches by the control signals to select the selected electrode from the first electrodes and the second electrodes, whereby the capacitance sensing apparatus measures the capacitance for the selected electrode with reduced signal lines.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 3:
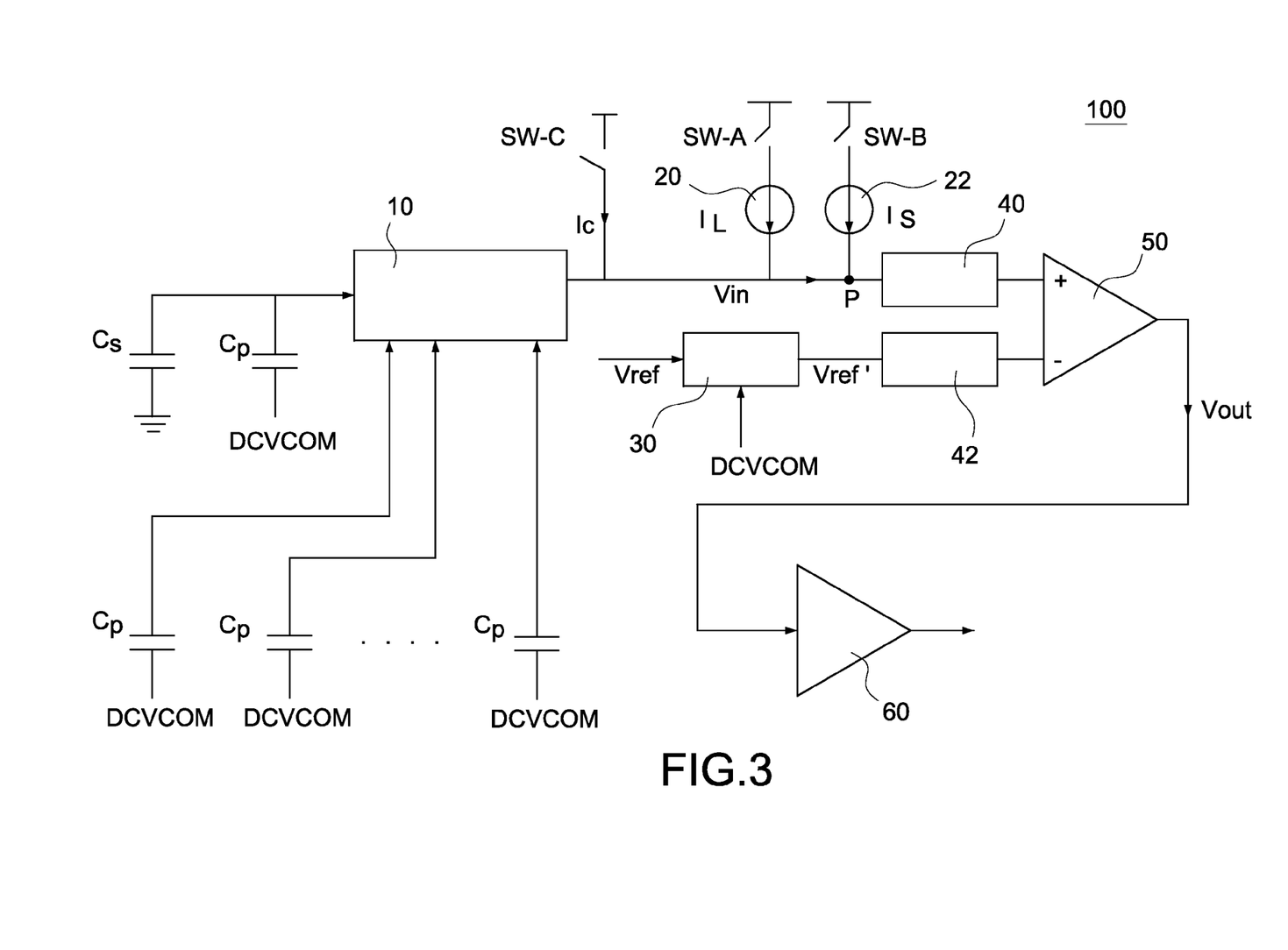
FIG. 3 shows the circuit diagram for the capacitance sensing apparatus according to an embodiment of the present invention.

FIG. 3 shows the circuit diagram for a capacitance sensing apparatus 100 according to an embodiment of the present invention, where the capacitance sensing apparatus 100 can be used with a multiplexer 10 to measure contact capacitance Cs for one selected electrode in the projected capacitive touch panel unit 300A shown in FIG. 1. The measurement will be detailed later. To simplify description, some components in FIG. 3 use the same numerals as those in FIGS. 1 and 2. Even not shown in FIG. 3, a controller (which is similar to the controller 30A shown in FIG. 1) is provided to control the multiplexer 10 and the capacitance sensing apparatus 100. Therefore, electrode selection, operational clock and touch position judgment are performed by the controller.

As shown in FIG. 3, the capacitance sensing apparatus 100 comprises a differential comparator 50, a first low-pass filter 40 and a second low-pass filter 42 electrically connected to the first input end (such as non-inverting input end V+) and the second input end (such as inverting input end V−) of the differential comparator 50, respectively, a reference voltage source 30 electrically connected to the second low-pass filter 42, a charging current source Ic electrically connected to the first low-pass filter 40 and the connection node P of the multiplexer 10, a first discharging current source 20 for supplying first discharging current $I_L$, a second discharging current source 22 for supplying second discharging current $I_s$. Moreover, the charging current source Ic, the first discharging current source 20 and the second discharging current source 22 are controlled by charging switch SW_C, first discharging switch SW_A and second discharging switch SW_B, respectively. The output of the comparator 50 is sent, through an output buffer 60, to the controller for further processing.

Figure 4A:
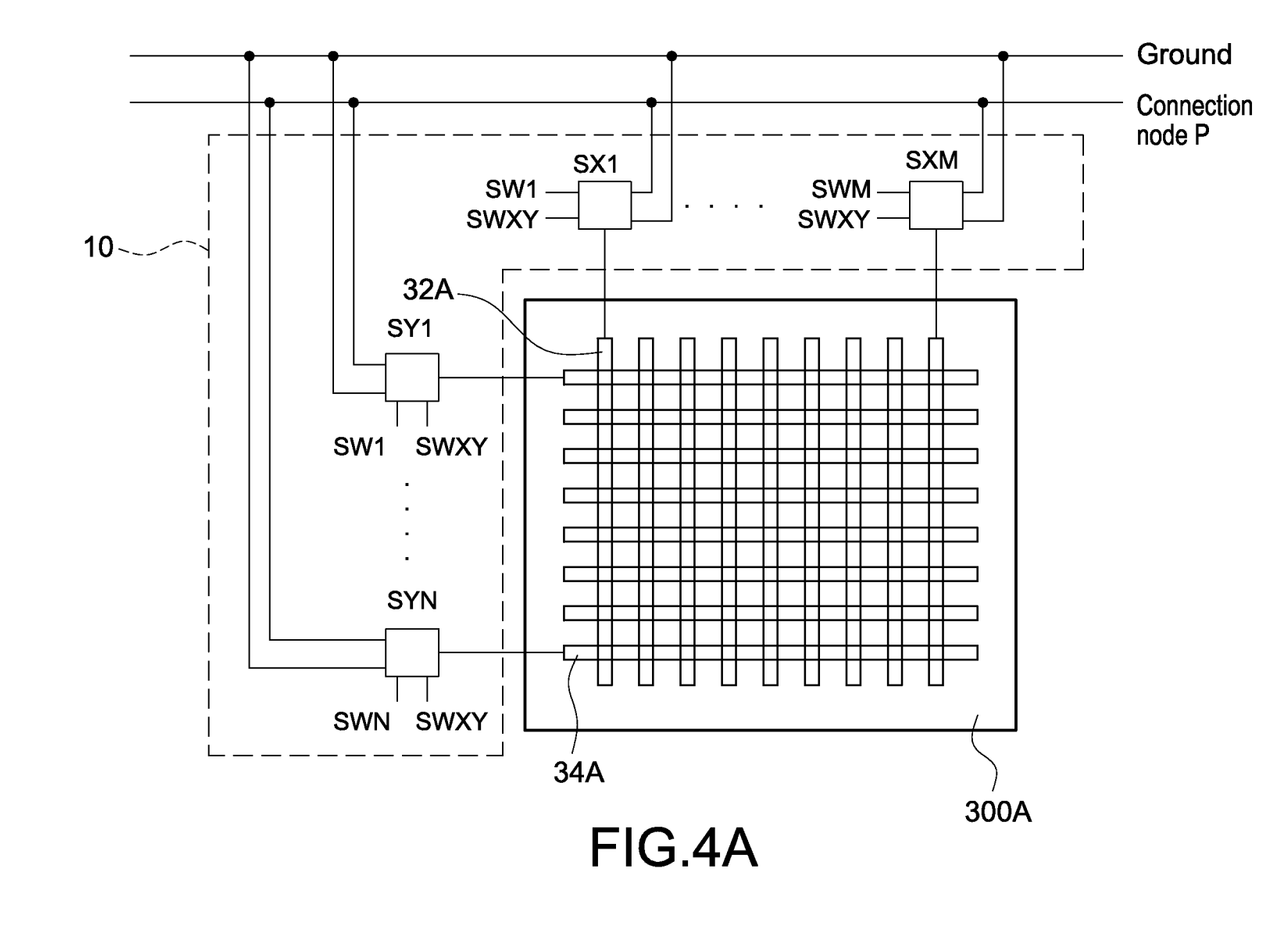
FIG. 4A shows a schematic diagram of the multiplexer according to an embodiment of the present invention.

FIG. 4A shows a schematic diagram of the multiplexer 10, where the multiplexer 10 is employed in the projected capacitive touch panel unit 300A shown in FIG. 1 and FIG. 4A also includes the projected capacitive touch panel unit 300A for demonstration. The multiplexer 10 comprises M longitudinal switches SX1-SXM corresponding to the M longitudinal stripe electrodes 32A of the projected capacitive touch panel unit 300A, and N transverse switches SY1-SYN corresponding to the N transverse stripe electrodes 34A of the projected capacitive touch panel unit 300A. Provided that M>N, the multiplexer 10 can control the M longitudinal switches SX1-SXM and the N transverse switches SY1-SYN by only (M+1) control lines. More particularly, when the multiplexer 10 wants to select the Kth X-direction switch to send signal of the Kth electrode to the connection node P, the multiplexer 10 selects X-direction switches by the XY control signal SWXY, and then turns on the Kth X-direction switch by the switch control signals SW1-SWM and grounds the remaining X-direction switches. Therefore, the signal on the Kth X-direction electrode can be sent to the connection node P. When the multiplexer 10 wants to select the Kth Y-direction switch to send signal of the Kth electrode to the connection node P, the multiplexer 10 selects Y-direction switches by the XY control signal SWXY, and then turns on the Kth Y-direction switch by the switch control signals SW1-SWM and grounds the remaining Y-direction switches. Therefore, the signal on the Kth Y-direction electrode can be sent to the connection node P. Therefore, the multiplexer 10 needs only (1+max(M, N)) signal lines and (M+N) switches to select one of the (M+N) electrodes for the connection node P, where (1+max(M, N)) is equal to (1+M) in this case because M>N. Therefore, the number of signal lines can be advantageously reduced.

Figure 4B:
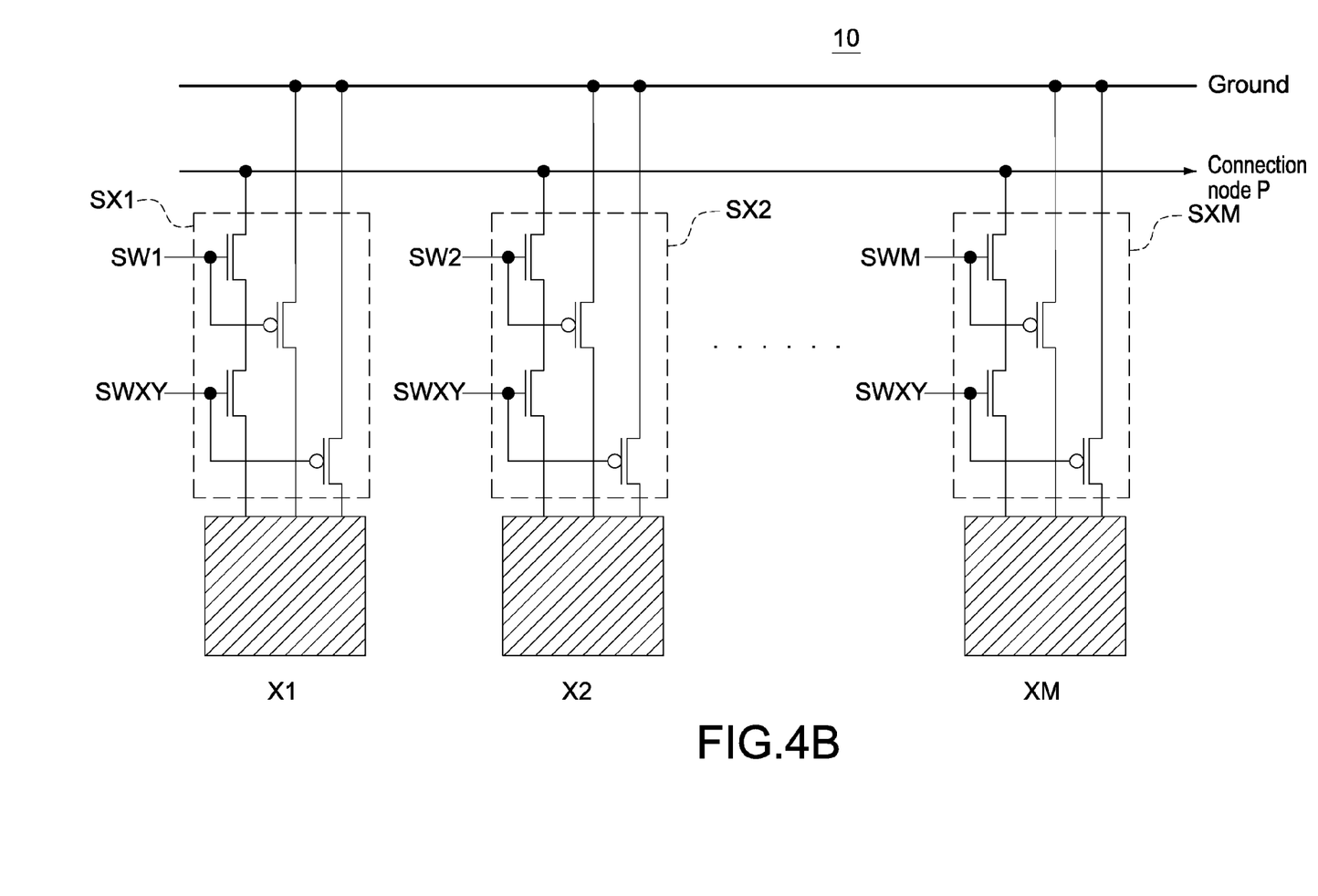
FIG. 4B shows a circuit diagram for a partial portion of the multiplexer in FIG. 4A.

FIG. 4B shows a circuit diagram for a partial portion of the multiplexer 10, which is corresponding to the M X-direction switches SX1-SXM. The circuit for the N Y-direction switches SY1-SYN can be implemented in similar way. As shown in FIG. 4B, each of the M X-direction switches SX1-SXM comprises four transistors, which are selectively connected to the connection node P or grounded by the switch control signals SWk(k=1 . . . M) and the XY control signal SWXY. More particularly, each of the M X-direction switches SX1-SXM comprises four transistors, where two transistors are serially connected between the connection node P and one electrode end X1-XM of the M longitudinal stripe electrodes 32A, while the remaining two transistors are parallel connected between the ground and the electrode end X1-XM of the M longitudinal stripe electrodes 32A.

Figure 5:
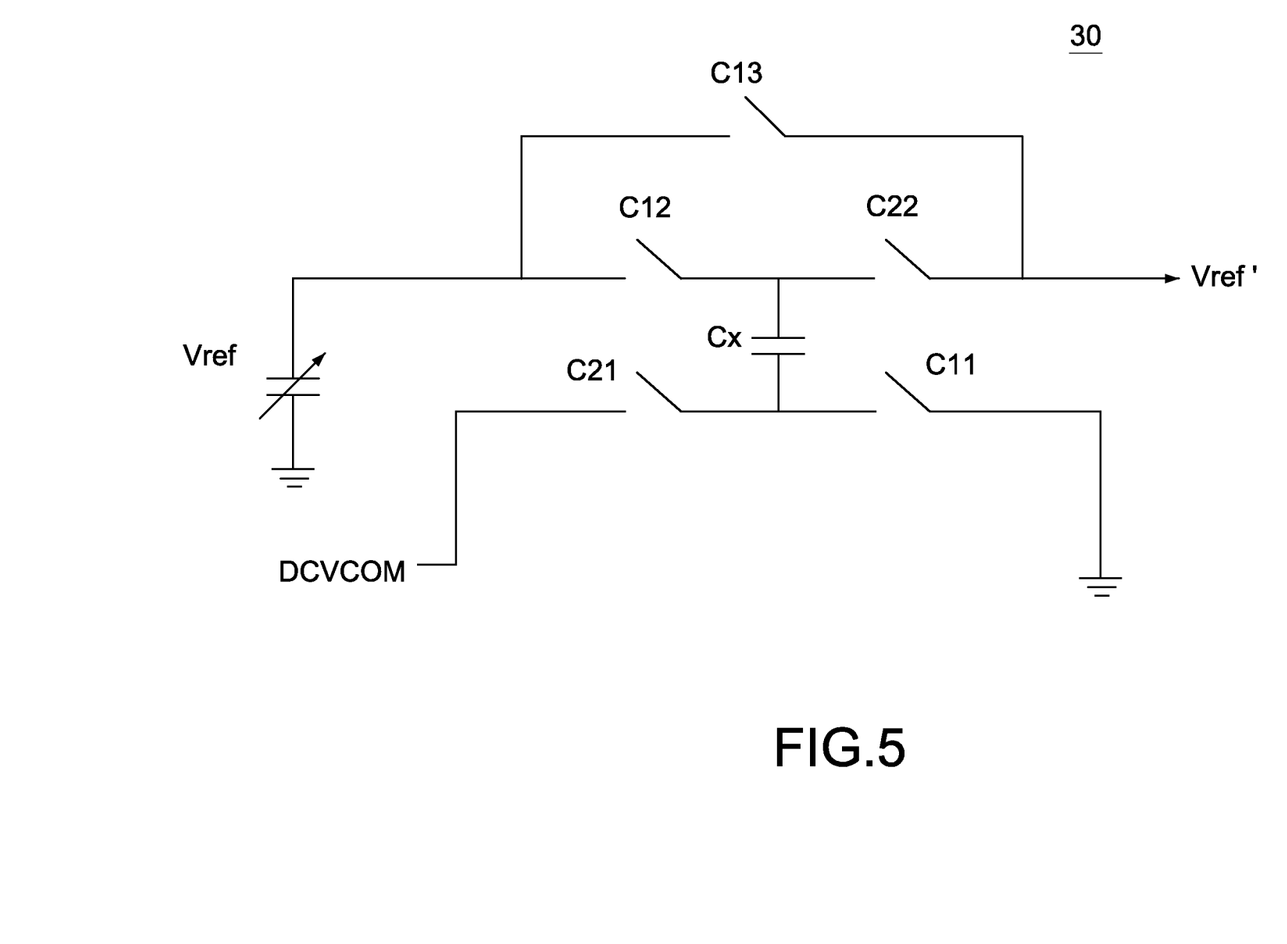
FIG. 5 shows a circuit diagram for the reference voltage source for the capacitance sensing apparatus according to an embodiment of the present invention.
Figure 9:
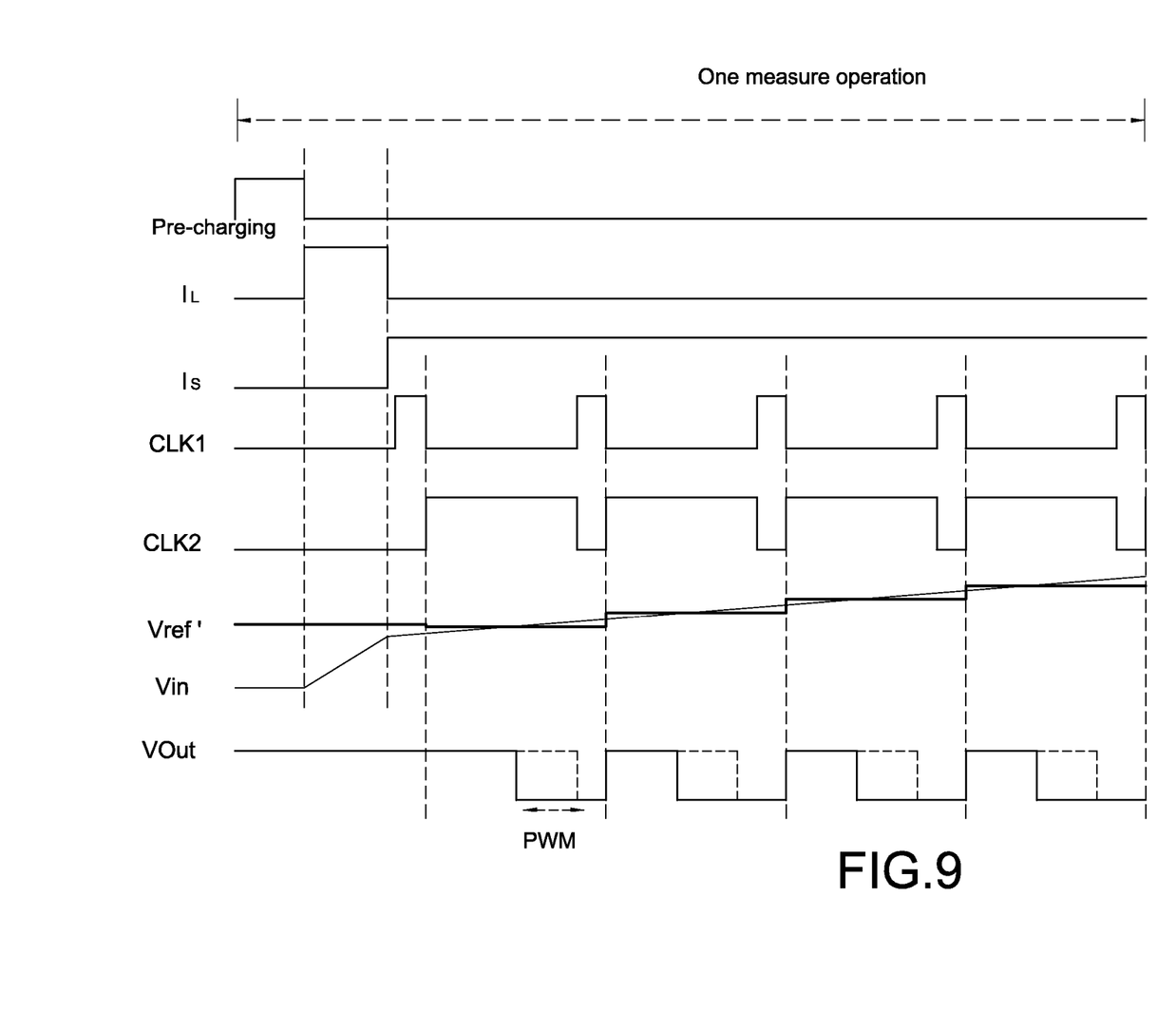
FIG. 9 shows waveforms demonstrating the operation of the capacitance sensing apparatus according to an embodiment of the present invention.

FIG. 5 shows a circuit diagram for a reference voltage source 30 for the capacitance sensing apparatus 100 according to an embodiment of the present invention. The reference voltage source 30 comprises a reference voltage Vref, a DC common voltage DCVCOM, five switching capacitors C11, C12, C13, C21 and C22 controlled by a first timing clock and a second timing clock, respectively, and a storage capacitor Cx. FIG. 9 shows the timing diagram of the first timing clock CLK 1 and the second timing clock CLK2, which are non-overlapped in time. When the first timing clock CLK 1 turns on (the second timing clock CLK2 turns off), the first switching capacitors C11, C12, C13 are closed and the second switching capacitors C21 and C22 are opened. Therefore, the reference voltage Vref is stored in the storage capacitor Cx. When the second timing clock CLK 2 turns on (the first timing clock CLK1 turns off), the second switching capacitors C21 and C22 are closed and the first switching capacitors C11, C12, C13 are opened. Therefore, the reference voltage Vref stored in the storage capacitor Cx is superimposed with the DC common voltage DCVCOM to form a modified reference voltage Vref. The modified reference voltage Vref is sent to the second input end of the differential comparator 50 for further processing.

With reference to FIG. 3, when noise is present at the DC common voltage DCVCOM, the noise is also coupled to the first input end of the differential comparator 50 through the stray capacitance Cp. Moreover, the modified reference voltage Vref also contains the noise from the DC common voltage DCVCOM and is supplied to the second input end of the differential comparator 50. Therefore, noise can be eliminated in differential way by the differential comparator 50. When the projected capacitive touch panel unit 300A is used for touch input of an LCD screen, the reference voltage source 30 can be employed with the differential comparator 50 to remove noise from the DC common voltage DCVCOM. LCD screen generally uses DC common voltage DCVCOM on common electrodes to reduce flicker. The common electrodes on upper plate and lower plate of the LCD screen are electrically connected through conductive wires. The projected capacitive touch panel unit 300A is generally placed on the upper plate of the LCD screen. The projected capacitive touch panel unit 300A should overcome the noise coupled to the upper plate from the lower plate and through the common electrodes. The reference voltage source 30 according to the present invention also incorporates noise from the DC common voltage DCVCOM and can be used with the differential comparator 50 to remove noise in differential way.

Figure 6:
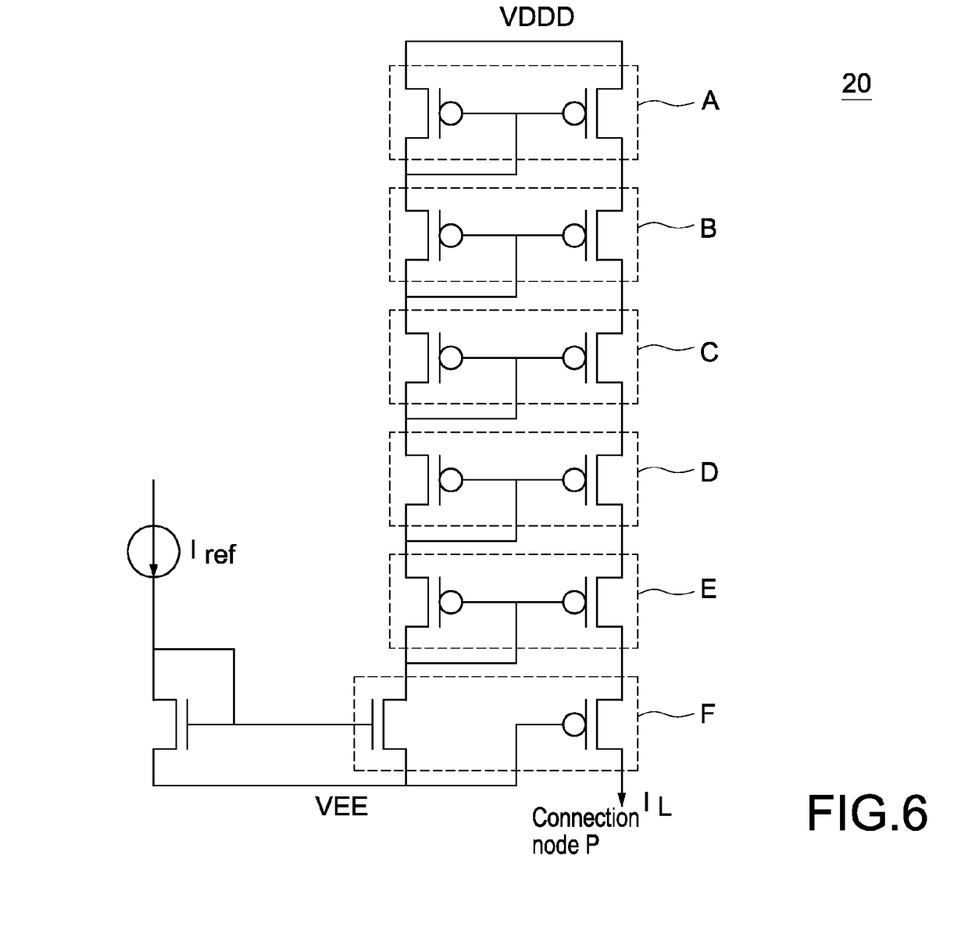
FIG. 6 shows the circuit diagram of the first discharging current source in the capacitance sensing apparatus according to an embodiment of the present invention.

FIG. 6 shows the circuit diagram of the first discharging current source 20 in the capacitance sensing apparatus 100 according to an embodiment of the present invention. The first discharging current source 20 comprises one input thin film transistor (TFT), which is not labeled and receives a current Iref, and six TFT pairs A-F to provide current source with large current when voltage swing at connection node P is −5V to 7V or more. When the voltage at connection node P is −5V, the six TFT pairs A-F operate at saturation region. When the voltage at connection node P is changed from −5V to 7V, the five TFT pairs B-F in turn operate at linear region. However, the voltage drop across the connection node P and the bias VDDD is mainly on the TFT pair A when the five TFT pairs B-F are operating at linear region. Therefore, TFT pair A still operates at saturation region and can provide sufficient current for discharging even large voltage swing occurs at the connection node P. Therefore, the large voltage swing can be present at the connection node P to enhance the measurement resolution for the capacitance sensing apparatus 100.

Figure 7:
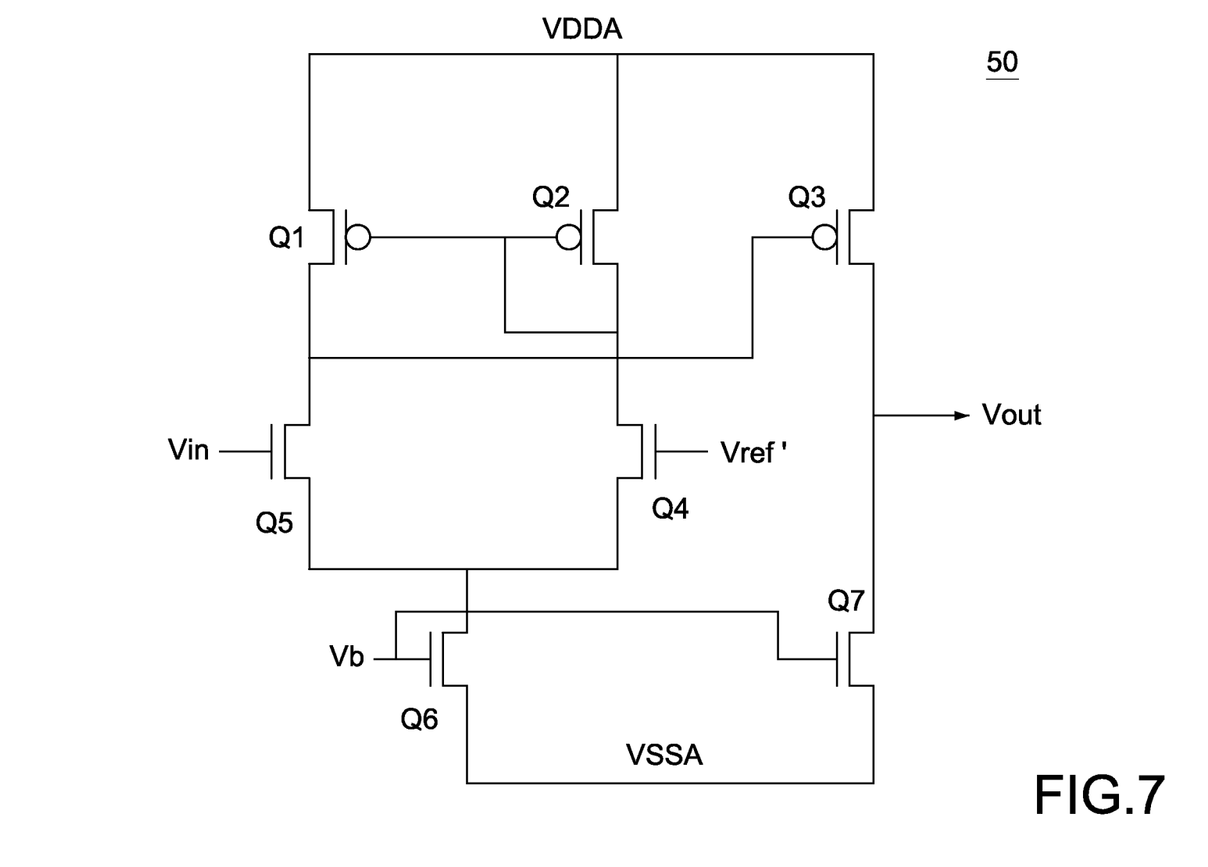
FIG. 7 shows the circuit diagram for the differential comparator in the capacitance sensing apparatus according to an embodiment of the present invention.

FIG. 7 shows the circuit diagram for the differential comparator 50 in the capacitance sensing apparatus 100 according to an embodiment of the present invention. The differential comparator 50 comprises seven MOS transistors Q1-Q7, where the positive bias VDDA is applied to the transistors Q1-Q3. The first input end of the differential comparator 50 is provided by the gate of the transistor Q5, and the second input end of the differential comparator 50 is provided by the gate of the transistor Q4. The transistor Q6 and Q7 are electrically connected to a reference bias Vb and a negative bias VSSA to provide a reference bias voltage for the differential comparator 50. The transistors Q6 and Q7 are electrically connected to the output end of the differential comparator 50. Therefore, the differential comparator 50 provides differential comparison for the input voltage Vin at the first input end and the modified reference voltage Vref at the second input end.

Figure 8:
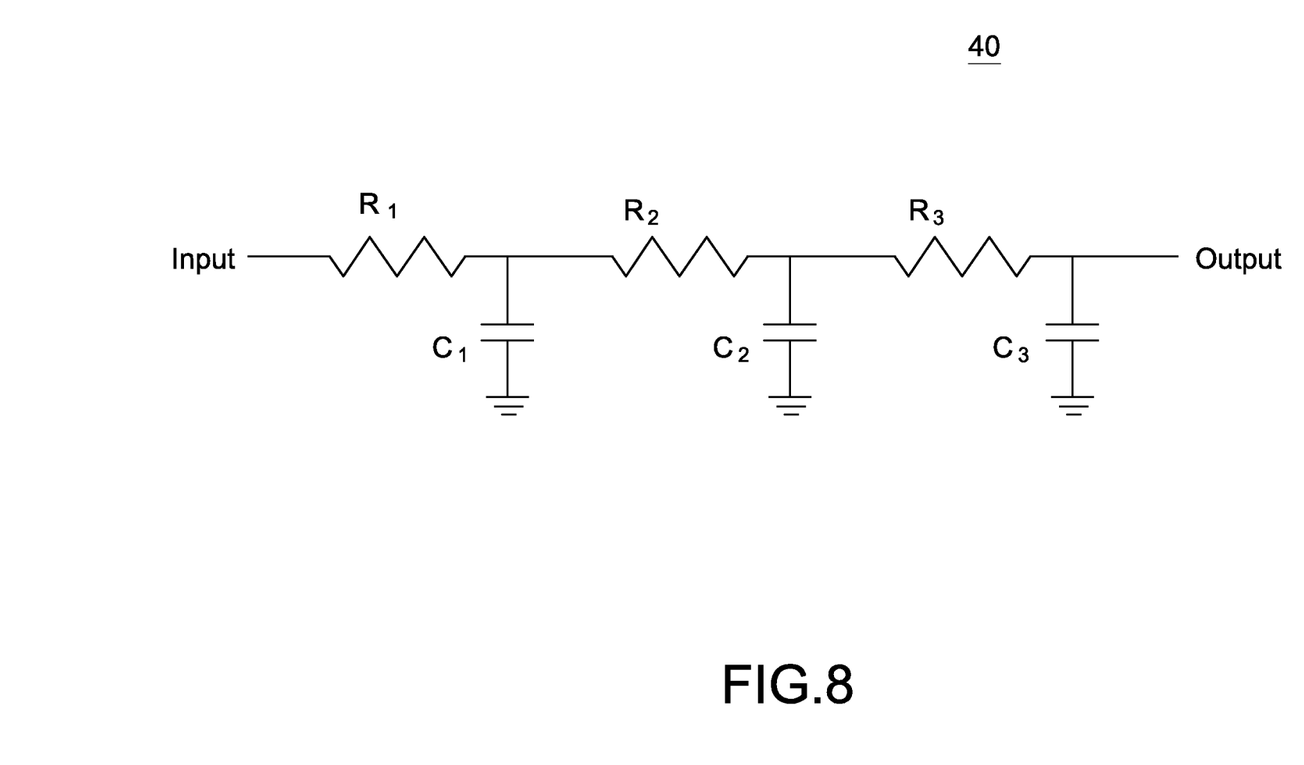
FIG. 8 shows circuit diagram for the first low pass filter in the capacitance sensing apparatus according to an embodiment of the present invention.

FIG. 8 shows circuit diagram for the first low pass filter 40 in the capacitance sensing apparatus 100 according to an embodiment of the present invention. The conventional low pass filter can be implemented by resistor-capacitor (RC) serial circuits and the load is connected to the capacitor. The first low pass filter 40 according to an embodiment of the present invention comprises three stages of serially-connected RC circuits. The resistor value and the capacitor value for each stage can be one third of those in conventional low pass filter. The low-pass cut off frequency can be advantageously reduced and noise can be effectively suppressed. The performance of the low pass filter will be degraded if the number of the serially-connected stages is equal to or more than four. Moreover, the second low pass filter 42 can also be implemented by multiple stages (such as three stages) of serially-connected RC circuits similar to the first low pass filter 40.

FIG. 9 shows waveforms demonstrating the operation of the capacitance sensing apparatus 100 according to an embodiment of the present invention, where the measurement is performed for one electrode. With reference also to FIG. 3, the controller controls the charging switch SW_C to charge the contact capacitor Cs and the stray capacitor Cp through the charging current source Ic. Afterward, the controller respectively controls the first discharging switch SW_A and second discharging switch SW_B to discharge the contact capacitor Cs and the stray capacitor Cp through the larger first current source 20 (providing current $I_L$) and the smaller second current source 22 (providing current $I_s$). During the discharging phase of the smaller second current source 22, the controller controls the first timing clock CLK 1 and the second timing clock CLK2 in non-overlapped way to generate the modified reference voltage Vref.

The differential comparator 50 compares the modified reference voltage Vref with the input voltage Vin, which is present at the connection node P and resulted from the contact capacitor Cs and the stray capacitor Cp. The differential comparator 50 generates a pulse width modulation (PWM) output signal Vout. The controller judges capacitance change by the pulse width in the output signal Vout. With reference also to FIGS. 4A and 4B, the multiplexer 10 selects X-direction electrodes or Y-direction electrodes by the signal SWXY and then selects a specific electrode for connecting to the connection node P by the switch control signal SW1-SWM. The multiplexer 10 also connects the un-selected electrodes to ground. The controllers can judge capacitance change by the pulse width in the output signal Vout for each electrode and then judge a touch position by the result for all electrodes. Moreover, as shown in FIG. 9, the controller can successively compare the modified reference voltage Vref with the input voltage Vin at the connection node P many times for one measurement operation, which results in many PWM signals. The controller can judge capacitance change by averaging the PWM signals.

Figure 10:
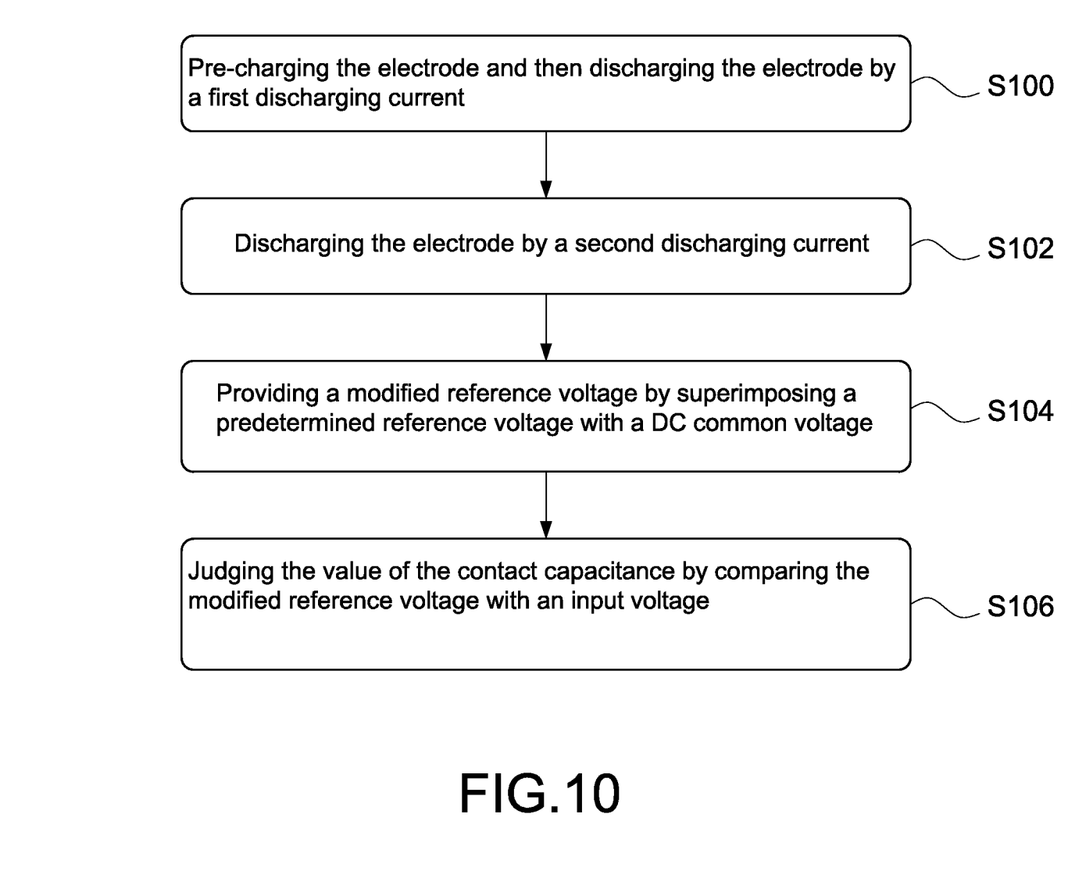
FIG. 10 shows the flowchart of a method for operating the capacitance sensing apparatus according to an embodiment of the present invention.

FIG. 10 shows the flowchart of a method for operating the capacitance sensing apparatus 100 according to an embodiment of the present invention, where the method is performed to measure the contact capacitance Cs for an electrode on a projected capacitive touch panel. At first the electrode is charged through the connection node P and then discharged by a first discharging current, which can be provided by the first current source 20 shown in FIG. 6 (S100). Afterward, the electrode is discharged by a second discharging current, which is smaller than the first discharging current (S102). A modified reference voltage Vref is generated by superimposing a predetermined reference voltage Vref with a DC common voltage DCVCOM, where the DC common voltage DCVCOM is electrically connected to an LCD panel and the capacitive touch panel (S104). During the discharging time for the second discharging current, the modified reference voltage Vref is compared with an input voltage at the connection node P to judge the value of the contact capacitance Cs (S106).

Moreover, the modified reference voltage Vref in step S104 can be provided by the reference voltage source 30 shown in FIG. 5. The reference voltage source 30 comprises a plurality of first switching capacitors C11, C12, C13, a plurality of second switching capacitors C21, C22, and a storage capacitor Cx. The first switching capacitors C11, C12, C13 and the second switching capacitors C21, C22 are controlled by non-overlapping first timing clock CLK1 and second timing clock CLK2, whereby a predetermined reference voltage Vref is superimposed with a DC common voltage DCVCOM to provide the modified reference voltage Vref. With reference also to FIGS. 3 and 8, the modified reference voltage Vref can be low-pass filtered before being compared with the input voltage Vin, where the low pass filtering is performed by serially connected resistors-capacitors as shown in FIG. 8. Moreover, in above-mentioned step S104, during the discharging process for the second discharging current, the modified reference voltage Vref can be successively compared with the input voltage Vin at connection node P many times, which results in many PWM signals. The capacitance can be judge changed by averaging the PWM signals.

Figure 11:
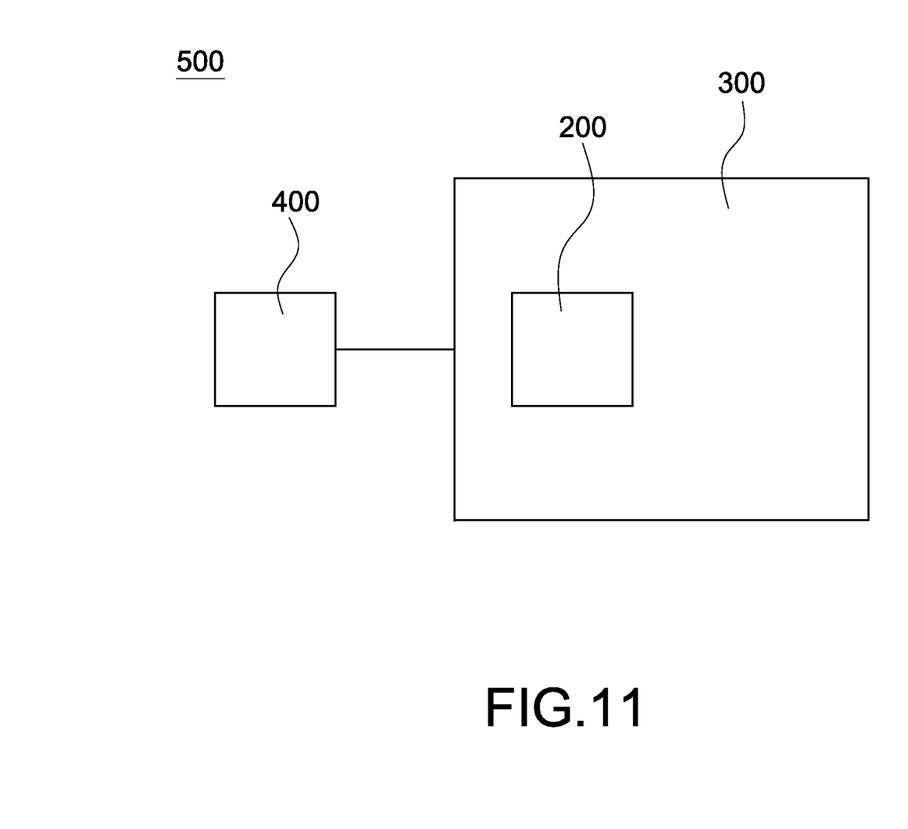
FIG. 11 schematically shows another embodiment of a system for displaying images.

FIG. 11 schematically shows another embodiment of a system 500 for displaying images which, in this case, is implemented to include a display module 300. The display module 300 comprises a capacitive touch panel 200, which is similar to the projected capacitive touch panel 300A shown in FIG. 4A. Moreover, the capacitance sensing apparatus 100 and the multiplexer 10 shown in FIG. 3 and FIG. 4A can be placed inside the capacitive touch panel 200 or outside the capacitive touch panel 200. The capacitance sensing apparatus 100 and the multiplexer 10 are not shown in FIG. 11 for brevity. An input module 400 is electrically connected to the display panel 300 to send input signal (including video signal) to the display panel 300 for displaying image or video corresponding to the input signal. The image displaying system 500 can be, for example, personal digital assistant (PDA), a display, a notebook computer, a digital camera, a car display, a panel computer, a television, a global positioning system (GPS), an avionics display, a digital photo frame, a portable DVD player or a mobile phone.

To sum up, the capacitance sensing apparatus according to the present invention and the associated capacitive touch panel use a reference voltage source to include noise into a modified reference voltage, and then the noise infecting the input signal can be removed by the modified reference voltage and a differential comparator. The comparison preciseness can be enhanced. The capacitance sensing apparatus according to the present invention has a first discharging current source with stable operation for large voltage swing. Therefore, the comparison resolution can be enhanced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A capacitance sensing apparatus used for a capacitive touch panel and electrically connected to one electrode of the capacitive touch panel through a connection node to measure a capacitance on the electrode, the capacitance sensing apparatus comprising:

a first discharging current source electrically connected the connection node to provide a first discharging current;

a second discharging current source electrically connected the connection node to provide a second discharging current, where the first discharging current is larger than the second discharging current;

a differential comparator comprising a first input end electrically connected to the connection node and a second input end;

a reference voltage source electrically connected to the second input end, wherein the reference voltage source receives a predetermined reference voltage and a DC common voltage of an liquid crystal display to generate a modified reference voltage, wherein the DC common voltage is also electrically connected to the capacitive touch panel;

wherein the differential comparator generates a pulse width modulation signal by comparing the modified reference voltage and an input voltage, which is present at the connection node and resulted from a touch on the capacitive touch panel;

wherein the pulse width modulation signal indicates the capacitance on the electrode.

2. The capacitance sensing apparatus in claim 1, wherein the reference voltage source comprises a plurality of first switching capacitors, a plurality of second switching capacitors, and a storage capacitor, wherein the first switching capacitors and the second switching capacitors are controlled by non-overlapping first timing clock and second timing clock, respectively such that the predetermined reference voltage is superimposed with the DC common voltage to generate the modified reference voltage.

3. The capacitance sensing apparatus in claim 1, wherein the first discharging current source comprises a plurality of thin film transistor pairs in serial connection, whereby the first discharging current has fixed value at the connection node.

4. The capacitance sensing apparatus in claim 1, further comprising a first low pass filter electrically connected between the connection node and the first input end, and a second low pass filter electrically connected between the modified reference voltage and the second input end.

5. The capacitance sensing apparatus in claim 4, wherein each of the first low pass filter and the second low pass filter comprises a plurality of serially-connected resistors and capacitors.

6. A method for measuring capacitance for a capacitive touch panel, the method measuring a capacitance on an electrode of the capacitive touch panel and comprising:
   a. charging the electrode through a connection node and then discharging the electrode with a first discharging current;
   b. discharging the electrode with a second discharging current, where the first discharging current is larger than the second discharging current;
   c. providing a modified reference voltage being a superimposition of a predetermined reference voltage and a DC common voltage of an liquid crystal display, wherein the DC common voltage is electrically connected to the capacitive touch panel;
   d. during the discharging of the second discharging current, judging the value of the capacitance by comparing the modified reference voltage and an input voltage present at the connection node.

7. The method in claim 6, wherein the step c further comprises:
   providing a plurality of first switching capacitors, a plurality of second switching capacitors, and a storage capacitor;
   wherein the first switching capacitors and the second switching capacitors are controlled by non-overlapping first timing clock and second timing clock, respectively, such that the predetermined reference voltage is superimposed with the DC common voltage to generate the modified reference voltage.

8. The method in claim 6, wherein the step d further comprises:
   performing low pass filtering for the modified reference voltage and the input voltage.

9. The method in claim 8, wherein the low pass filtering is performed by a plurality of serially-connected resistors and capacitors.

10. The method in claim 6, wherein the step d further comprises:
   during the discharging of the second discharging current, generating a plurality of pulse width modulation signals by successively comparing the modified reference voltage and the input voltage; and
   calculating the value of the capacitance by averaging the plurality of pulse width modulation signals.

11. A capacitive touch panel comprising:
   a plurality of first electrodes in longitudinal direction and having a first number M;
   a plurality of second electrodes in transversal direction and having a second number N;
   a capacitance sensing apparatus electrically connected a selected electrode at a connection node, wherein the selected electrode is selected from the first electrodes and the second electrodes, the capacitance sensing apparatus comprising:
      a first discharging current source electrically connected the connection node to provide a first discharging current;
      a second discharging current source electrically connected the connection node to provide a second discharging current, where the first discharging current is larger than the second discharging current;
      a differential comparator comprising a first input end electrically connected to the connection node and a second input end;
      a reference voltage source electrically connected to the second input end, wherein the reference voltage source receives a predetermined reference voltage and a DC common voltage of an liquid crystal display to generate a modified reference voltage, wherein the DC common voltage is also electrically connected to the capacitive touch panel;
   wherein the differential comparator generates a pulse width modulation signal by comparing the modified reference voltage and an input voltage, which is present at the connection node and resulted from a touch on the capacitive touch panel;
   wherein the pulse width modulation signal indicates the capacitance on the electrode.

12. The capacitive touch panel in claim 11, further comprising a multiplexer, the multiplexer comprising a plurality of switches corresponding to and electrically connected to the first electrodes and the second electrodes, wherein the multiplexer generate a third number of control signals and the third number is equal to one plus the larger of the first number M and the second number N;
   wherein the multiplexer controls the switches by the control signal to select the selected electrode from the first electrodes and the second electrodes, whereby the capacitance sensing apparatus measures the capacitance for the selected electrode.

13. The capacitive touch panel in claim 12, wherein each of the switches comprises four transistors, two transistors being serially connected between the capacitance sensing apparatus and one of the first electrodes and the second electrodes, the other two transistors being parallel connected between a ground and one of the first electrodes and the second electrodes.

14. The capacitive touch panel in claim 13, wherein the control signals comprises one XY control signal and a plurality of switch control signals with a number being the larger of the first number M and the second number N, the XY control signal is electrically connected to each of the switch to select the first electrodes or the second electrodes;

wherein the switch control signals are electrically connected to respective switches to select the selected electrode.

15. The capacitive touch panel in claim 14, wherein M and N are integer larger than one.

16. The capacitive touch panel in claim 11, wherein the reference voltage source comprises a plurality of first switching capacitors, a plurality of second switching capacitors, and a storage capacitor, wherein the first switching capacitors and the second switching capacitors are controlled by non-overlapping first timing clock and second timing clock, respectively, such that the predetermined reference voltage is superimposed with the DC common voltage to generate the modified reference voltage.

17. The capacitive touch panel in claim 11, wherein the first discharging current source comprises a plurality of thin film transistor pairs in serial connection, whereby the first discharging current has fixed value at the connection node.

18. The capacitive touch panel in claim 11, further comprising a first low pass filter electrically connected between the connection node and the first input end, and a second low pass filter electrically connected between the modified reference voltage and the second input end.

19. An image displaying system comprising:
    a display module having a capacitive touch panel in comprising:
    a plurality of first electrodes in longitudinal direction and having a first number M;
    a plurality of second electrodes in transversal direction and having a second number N;
    a capacitance sensing apparatus electrically connected a selected electrode at a connection node, wherein the selected electrode is selected from the first electrodes and the second electrodes, the capacitance sensing apparatus comprising:
        a first discharging current source electrically connected the connection node to provide a first discharging current;
        a second discharging current source electrically connected the connection node to provide a second discharging current, where the first discharging current is larger than the second discharging current;
        a differential comparator comprising a first input end electrically connected to the connection node and a second input end;
        a reference voltage source electrically connected to the second input end, wherein the reference voltage source receives a predetermined reference voltage and a DC common voltage of an liquid crystal display to generate a modified reference voltage, wherein the DC common voltage is also electrically connected to the capacitive touch panel;
        wherein the differential comparator generates a pulse width modulation signal by comparing the modified reference voltage and an input voltage, which is present at the connection node and resulted from a touch on the capacitive touch panel;
        wherein the pulse width modulation signal indicates the capacitance on the electrode, and
    an input module electrically connected to the display module for sending an input signal to the display module, whereby the display module displays an image for the input signal.

20. The image displaying system in claim 19, wherein the image displaying system is personal digital assistant (PDA), a display, a notebook computer, a digital camera, a car display, a panel computer, a television, a global positioning system (GPS), an avionics display, a digital photo frame, a portable DVD player or a mobile phone.

* * * * *